United States Patent
Sabouri

(10) Patent No.: US 6,563,445 B1
(45) Date of Patent: May 13, 2003

(54) SELF-CALIBRATION METHODS AND STRUCTURES FOR PIPELINED ANALOG-TO-DIGITAL CONVERTERS

(75) Inventor: Faramarz Sabouri, Lawrenceville, NJ (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/995,967

(22) Filed: Nov. 28, 2001

(51) Int. Cl.[7] .................. H03M 1/10; H03M 1/50
(52) U.S. Cl. ........................ 341/120; 341/161
(58) Field of Search ................ 341/118, 120, 341/138, 156, 166, 172, 161

(56) References Cited

U.S. PATENT DOCUMENTS

| | | | |
|---|---|---|---|
| 5,499,027 A | 3/1996 | Karanicolas | 341/120 |
| 5,510,789 A | 4/1996 | Lee | 341/120 |
| 5,635,937 A * | 6/1997 | Lim et al. | 341/161 |
| 5,668,549 A | 9/1997 | Opris et al. | 341/118 |
| 6,184,809 B1 | 2/2001 | Yu | 341/120 |
| 6,232,898 B1 | 5/2001 | Nagaraj | 341/120 |
| 6,369,744 B1 * | 4/2002 | Chuang | 341/161 |
| 6,445,319 B1 * | 9/2002 | Bugeja | 341/138 |
| 6,456,211 B2 * | 9/2002 | Wu et al. | 341/120 |
| 6,486,807 B2 * | 11/2002 | Jonsson | 341/120 |

* cited by examiner

*Primary Examiner*—Patrick Wamsley
(74) *Attorney, Agent, or Firm*—Koppel, Jacobs, Patrick & Heybl

(57) ABSTRACT

Self-calibration methods and structures are provided for pipelined ADCs which can be realized without requiring external measuring instruments or calibrators, without requiring major changes in pipeline structure and which can be rapidly obtained with stored calibration processes. In method embodiments, each of selected converter stages are calibrated by using succeeding stages as sub-ADCs which measure gain error at a transition step in a selected stage's residue transfer characteristic and saves the gain error as a calibration constant $C_{cal}$ for that stage. After a first calibration constant $C_{cal}$ has been obtained, the process is successively repeated for preceding converter stages except that previously-obtained calibration constants are multiplied by their respective stage's digital input signals $D_{in}$ to obtain weighted calibration constants $C_{cal_{wtd}}$ which are included in measured gain errors to thereby obtain preceding calibration constants $C_{cal}$.

27 Claims, 10 Drawing Sheets

US 6,563,445 B1

SELF-CALIBRATION METHODS AND STRUCTURES FOR PIPELINED ANALOG-TO-DIGITAL CONVERTERS

BACKGROUND OF THE INVENTION

1. Field of the Invention

The present invention relates generally to analog-to-digital converters and, more particularly, to pipelined analog-to-digital converters.

2. Description of the Related Art

Each converter stage of an N-bit pipelined ADC successively realizes at least one respective level in a successive approximation of an analog input signal. Although the conversion of each input analog signal requires N cycles, the pipeline architecture allows N conversions (each at a different respective level) to proceed simultaneously with a digital output signal thereby produced each cycle. Accordingly, pipelined ADC structures realize extremely high throughput rates and facilitate identical stage structures. Without some form of correction, however, the converter stages of pipelined ADCs typically generate signal processing errors which degrade the overall signal conversion.

One exemplary converter stage structure for pipelined ADCs compares its respective analog input to a single reference (e.g., ground) and, in response to this comparison, generates a 1-bit digital signal which is provided to a succeeding converter stage as an digital input signal $D_{in}$. In addition, this structure provides the succeeding converter stage with an analog residue signal $S_{res}$ which is an amplified difference between the respective analog input and an analog version of $D_{in}$.

A widely used structure for generating the analog residue signal $S_{res}$ comprises an amplifier and an arrangement of switched capacitors. This is an effective and economical converter stage structure which facilitates integrated circuit fabrication but, in practice, it typically introduces errors into the analog residue signal $S_{res}$ because of signal processing errors which include charge-injection errors (due to switching actions), comparator-offset errors and capacitor-mismatch errors.

Another exemplary pipelined converter stage compares its respective analog input to a pair of spaced references (e.g., $\pm V_{ref}$) to thereby generate a 1.5-bit digital input signal $D_{in}$ (in which $D_{in}$ has three possible values rather than two) and a corresponding analog residue signal $S_{res}$ which are both passed to a succeeding converter stage. This signal redundancy effectively reduces errors due to comparator offset but has no effect on capacitor-mismatch errors.

Although calibration procedures have been proposed to correct the capacitor-mismatch errors (e.g., see U.S. Pat. Nos. 5,499,027, 5,510,789, 5,668,549, 6,184,809 and 6,232,898), they generally suffer from a variety of disadvantages, e.g., they are difficult to implement, time consuming and require additional converter structure and/or additional conversion process steps,

BRIEF SUMMARY OF THE INVENTION

The present invention is directed to self-calibration methods and structures for pipelined ADCs which can be realized without requiring external measuring instruments or calibrators, without requiring major changes in pipeline structure and which can be rapidly obtained with stored calibration processes.

In particular method embodiments of the invention, each of selected converter stages are calibrated by using succeeding stages as sub-ADCs which measure gain error at a transition step in a selected stage's residue transfer characteristic and saves the gain error as a calibration constant $C_{cal}$ for that stage.

After a first calibration constant $C_{cal}$ has been obtained, the process is successively repeated for preceding converter stages except hat previously-obtained calibration constants are multiplied by their respective stage's digital input signals $D_{in}$ to obtain weighted calibration constants $C_{cal_{wtd}}$ which are included in measured gain errors to thereby obtain preceding calibration constants $C_{cal}$.

If desired, the ADC calibration processes of the invention can be disabled and the same ADC operated without calibration.

The invention also teaches methods for economically storing the calibration constants $C_{cal}$ as incremental constants $C_{inc}$ from which the calibration constants can be recovered when needed.

The novel features of the invention are set forth with particularity in the appended claims. The invention will be best understood from the following description when read in conjunction with the accompanying drawings.

DETAILED DESCRIPTION OF THE INVENTION

Figure 1:
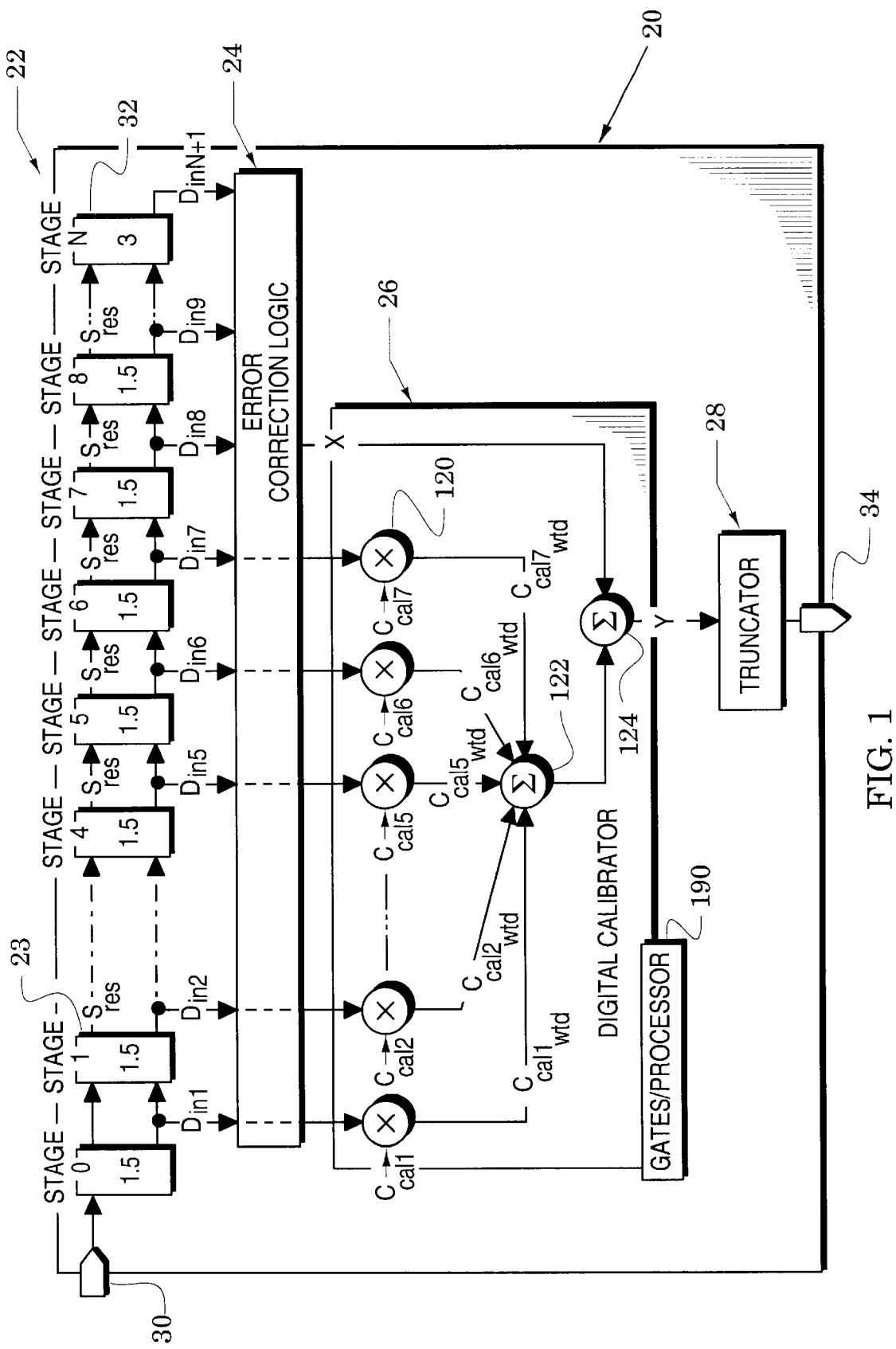
FIG. 1 is a block diagram of a pipelined ADC of the present invention.

In accordance with the present invention, FIG. 1 illustrates a pipelined ADC 20 that includes serially-connected converter stages 22, error correction logic 24, a digital calibrator 26 and a truncator 28. For descriptive purposes, the illustrated ADC 20 is configured as an exemplary 14-bit embodiment of the invention in which analog input signals at an input port 30 are processed through thirteen 1.5-bit converter stages (for illustrative simplicity, only exemplary stages (e.g., stage 23) are shown) and a final 3-bit converter stage 32.

In order to avoid accumulation of round-off errors in front end converter stages, the exemplary ADC's internal resolution (i.e., that of the output signal X of the error correction logic 24) is preferably a few bits higher than its external resolution (i.e., that of the output signal Y of the digital calibrator 26). Accordingly, the 1.5-bit converter stages and the 3-bit converter stage provide 16 bits of resolution in the output signal X (of the error correction logic 24) and the two extra bits are used to reduce accumulated roundoff errors in calibration constants $C_{cal}$ and thus provide high-resolution calibration constants $C_{cal}$ and a high-resolution signal Y from the digital calibrator 26. The truncator 28 then truncates the output signal Y to realize the 14 bit digital output signal at the converter output port 34.

Figure 2A:
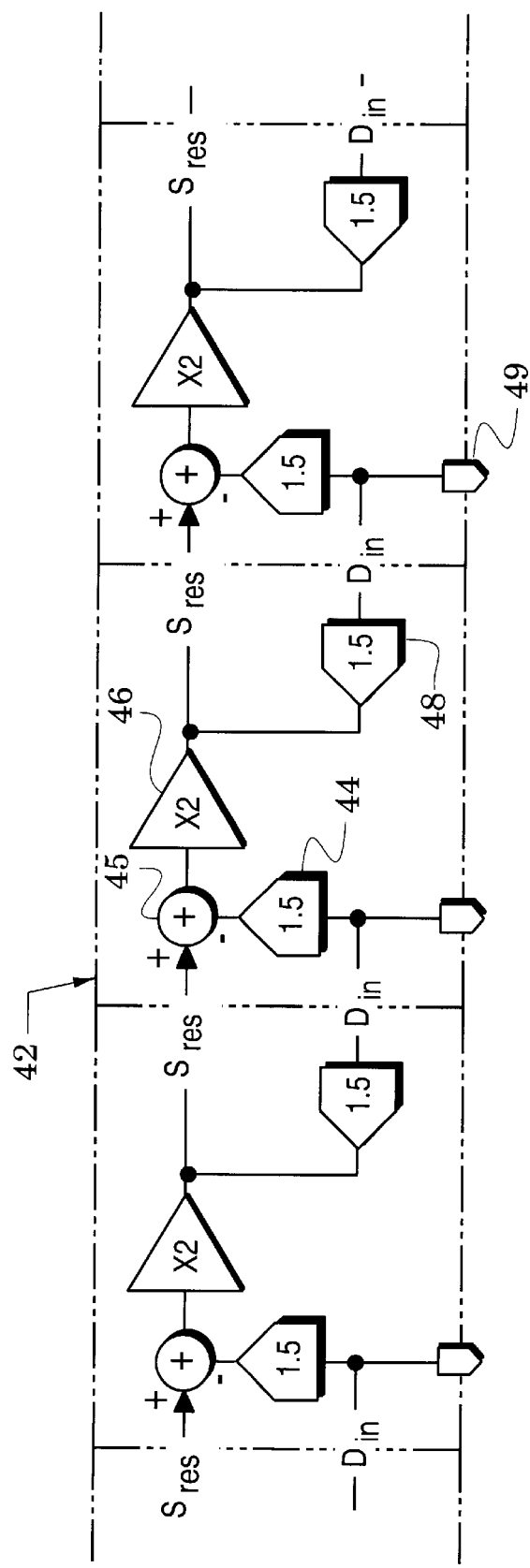
FIG. 2A is a block diagram of 1.5 bit converter stages in the pipelined ADC of FIG. 1.
Figure 2B:
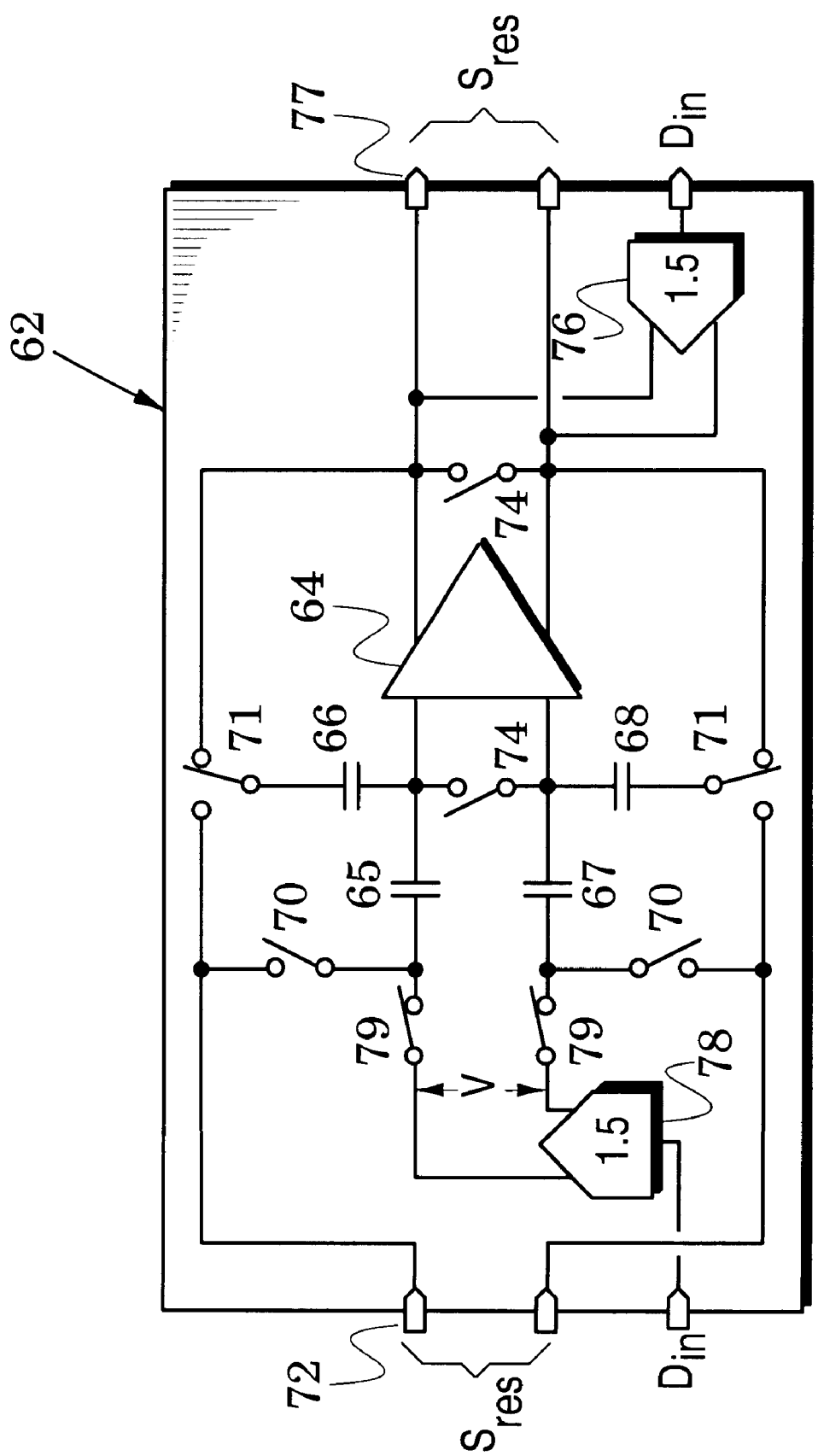
FIG. 2B is a differential switched-capacitor converter stage realization of the converter stages of FIG. 2A.

A subsequent operational description of the digital calibrator 26 of FIG. 1 and associated calibration methods (and a summary of its advantages) is enhanced by preceding it with the following investigation of exemplary 1.5-bit converter stages of FIGS. 2A and 2B. In particular, FIG. 2A illustrates serially-connected converter stages in which each stage 42 has a 1.5-bit digital-to-analog converter (DAC) 44, a subtractor 45, an amplifier 46 with a gain of two and a 1.5-bit flash ADC 48.

In operation of an exemplary converter stage 42, it receives a residue signal $S_{res}$ and digital input signals $D_{in}$ from a preceding stage. The digital input signals $D_{in}$ are converted in the DAC 44 to a corresponding analog signal. This analog signal is subtracted from the residue signal $S_{res}$ in the subtractor 45 and the resultant difference is amplified by the amplifier 46 to form an output residue signal $S_{res}$ that is passed to the succeeding converter stage.

This output residue signal $S_{res}$ is processed by the 1.5-bit ADC 48 to provide digital input signals $D_{in}$ to the succeeding converter stage and to an output port 49 that would typically be coupled to error correction logic (e.g., the error correction logic 24 of FIG. 1). The structure of FIG. 2A facilitates simultaneous signal conversion in each of the stages 42 wherein in each conversion cycle, each stage is processing a residue signal $S_{res}$ and digital input signals $D_{in}$ that were generated by the preceding stage in the preceding conversion cycle. The gain of the amplifier 46 matches the residue signal $S_{res}$ amplitude to the input range of the succeeding stage.

FIG. 2B illustrates a differential switched-capacitor realization 62 of a converter stage 42 of FIG. 2A. The converter stage 62 has a high-gain operational amplifier 64 and first capacitors 65 and 67 and second capacitors 66 and 68 that are coupled to the amplifier's input. The stage 62 also has switches 70 and 71 that respectively couple the first and second capacitors to receive a residue signal $S_{res}$ from an input port 72 in a sampling operational phase. In this sampling phase, additional switches 74 typically short the input and output of the amplifier 64. A 1.5-bit ADC 76 generates digital input signals $D_{in}$ for a succeeding converter stage in response to the output residue signal $S_{res}$ at an output port 77 and a 1.5-bit DAC 78 generates an analog signal V in response to digital input signals $D_{in}$ of a preceding converter stage.

In an operational output phase, the switches 70 and 74 are opened, the switches 71 couple the second capacitors 66 and 68 across the amplifier 64 and switches 79 couple the first capacitors 65 and 67 to receive the analog signal V from the DAC 78. In response, the amplifier 64 generates an output residue signal $S_{res}$. Switches 70, 71, 74 and 79 are shown in an output phase of the converter stage 62.

The residue transfer characteristic of the converter stage 62 is $$S_{res_{out}} = \left(1 + \frac{C_{s1}}{C_{s2}}\right) S_{res_{in}} - \frac{1}{2}\left(\frac{C_{65}}{C_{66}} + \frac{C_{67}}{C_{68}}\right) V \quad (1)$$

wherein $C_{s1}$ is the series combination of the first capacitors 65 and 67, $C_{s2}$ is the series combination of the second capacitors 66 and 68 and V is $-V_{ref}$, 0 and $V_{ref}$ for digital input signals $D_{in}$ of 00, 01 and 10 respectively ($D_{in}$ expressed in binary form). If the first and second capacitors are matched (i.e., equal), equation (1) becomes $$S_{res_{out}} = 2S_{res_{in}} - V. \quad (2)$$

Figure 3A:
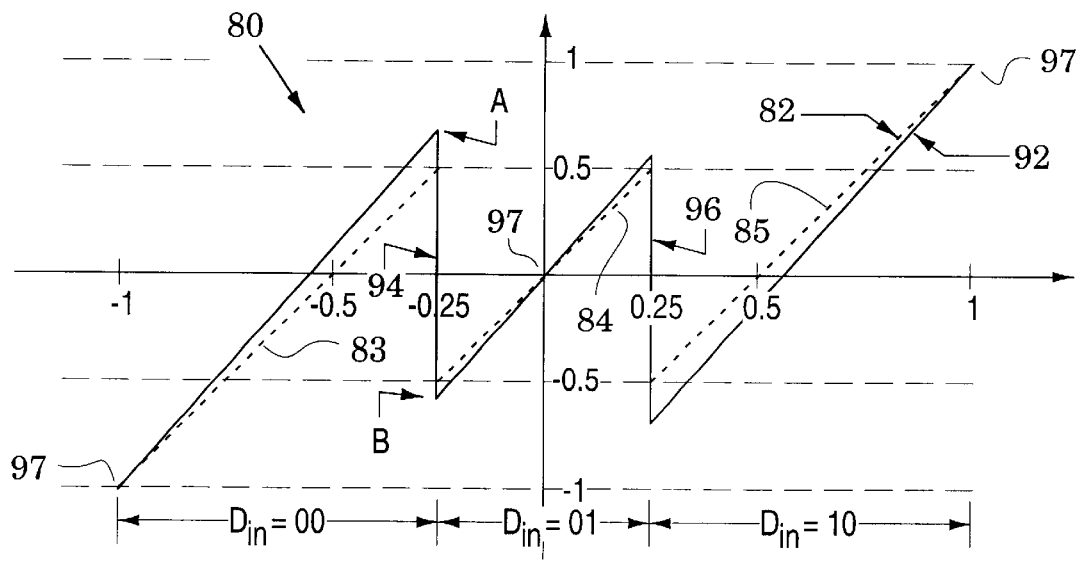
FIG. 3A is a diagram of the residue transfer characteristic of the converter stage of FIG. 2B.

Equation (2) is shown as the broken-line plot 82 in the residue transfer characteristic graph 80 of FIG. 3A in which the abscissa represents the range of all possible input residues and the ordinate represents output residues that the stage generates in response. It is assumed in FIG. 3A that the converter stage of FIG. 2B has a ±1 volt input range and the 1.5-bit ADC 78 comprises a pair of comparators that respectively compare the input analog residue to reference signals −0.25 and +0.25 volts (i.e., $V_{ref}=0.25$ volt).

When the input analog residue signal $S_{res_{in}}$ is between these reference signals $S_{res_{out}}=2S_{res_{in}}$ as indicated by the broken-line plot segment 84 which has a slope of 2. When the input analog residue signal $S_{res_{in}}$ is below and above these reference signals, the residue transfer characteristic still has a slope of 2 as indicated by broken-line plot segments 83 and 85 (the plot segments 83–85 are coupled by transition steps 94 and 96).

Equation (1) is shown as the solid-line plot 92 of FIG. 3A wherein it is assumed that the first and second capacitors are mismatched (i.e., capacitor ratios deviate from 1). The invention recognizes that the slopes of the plot segments now change from 2 but remain substantially equal and that capacitor mismatch shows up as gain error at the transition steps 94 and 96. It is further noted that the plots 82 and 92 essentially pivot about plot points 97.

Although these points are shown fixed in FIG. 3A, this is strictly true for single-ended implementations of the converter stage 62 of FIG. 2B and substantially true for differential implementations (the relative deviation of these points is of the order of 0.004% for a capacitor mismatch of 1%). The fact that the two outer plot points 97 remain essentially fixed insures that succeeding converter stages are not driven out of their ranges.

It has generally been found that uncalibrated 1.5-bit converter stages (e.g., the stage 62 of FIG. 2B) can limit differential nonlinearity (DNL) and integral nonlinearity (INL) errors on the order of 9 to 10 bits. The invention recognizes this is insufficient for most high performance serially-connected ADCs, that calibration or trimming is required to raise this limit and that the limitation is substantially due to capacitor mismatch.

Accordingly, the invention provides a calibration method in which errors of selected converter stages are measured using an ADC formed by succeeding stages. In particular, the gain error is measured at either of the transition steps 94 and 96 of FIG. 3A wherein the gain error is the difference between the actual residue jump of the solid-line plot 92 and the ideal residue jump of the broken-line plot 82. This measured gain error is then applied as a calibration constant $C_{cal}$ for its respective converter stage.

Figure 4A:
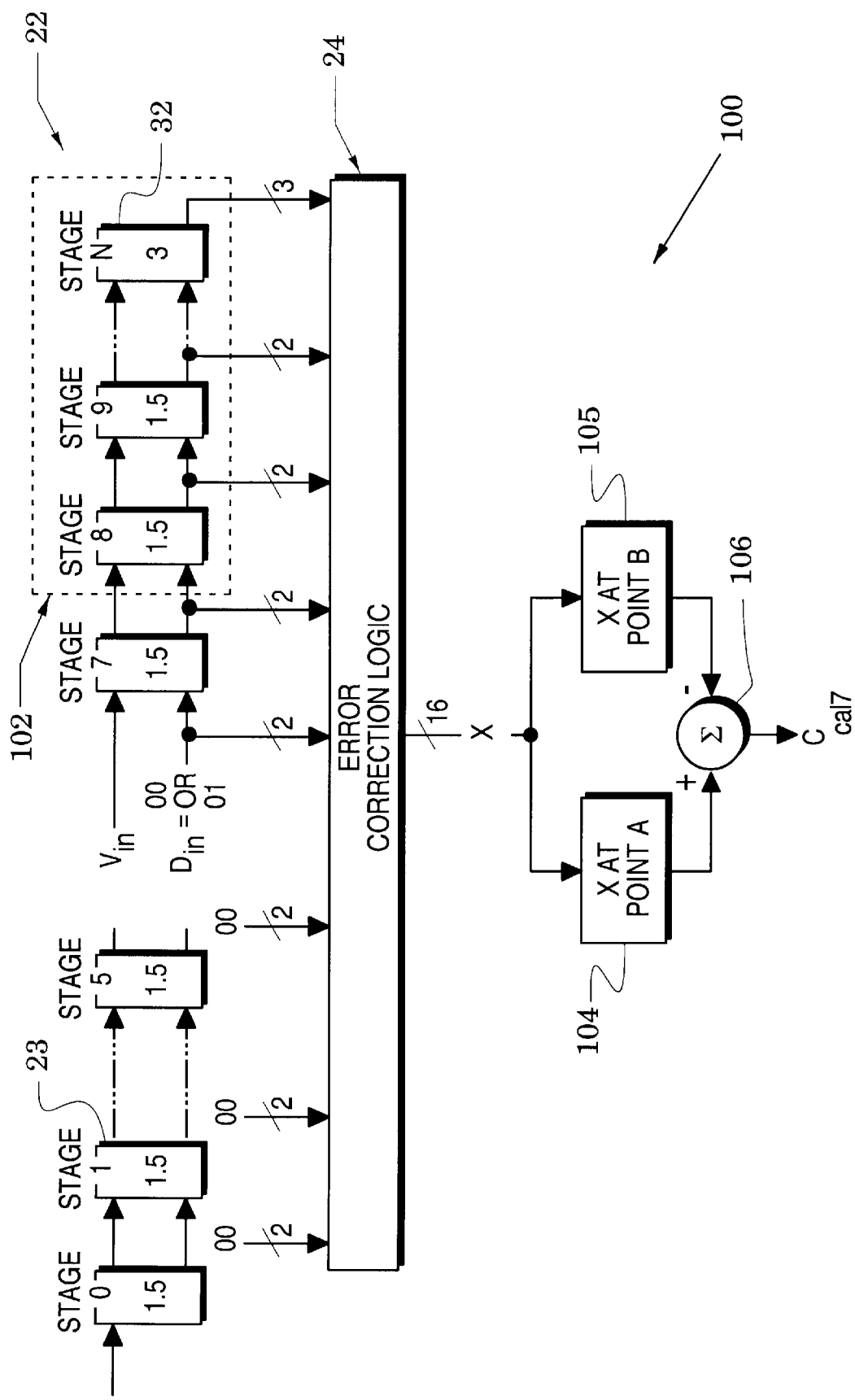
FIGS. 4A and 4B are block diagrams that illustrate calibration process steps for the ADC of FIG. 1.

This process is initially illustrated for converter stage 7 in the block diagram 100 of FIG. 4A which includes elements of FIG. 1 with like elements indicated by like reference numbers. In a first process step, an input voltage $V_{in}$ of −0.25 volts (it is noted that this analog voltage is generally available at the output of a resistive ladder that sets threshold voltages of stage 7's flash comparators) is applied to stage 7 (i.e., is applied as an input residue signal) and stage 7's digital input signal $D_{in}$ is cycled between 00 and 01. This causes the residue transfer characteristic of stage 7 to cycle up and down the transition step 94 of FIG. 3A.

The response of stage 7 is measured with a sub-ADC 102 that comprises succeeding stages (i.e., converter stages 8, 9 - - - N). The code in signal X at the output of the digital correction logic will cycle between codes that correspond to the top and bottom of the solid-line plot 92 at the transition step 94, i.e., between points A and B in FIG. 3A. These codes correspond to the digital input signals $D_{in}$ of converter stages 7–N and are respectively represented in FIG. 4A by blocks 104 and 105. The measurements of points A and B are preferably repeated (e.g., for a few hundred times) and averaged to cancel any effects due to noise.

The difference between the signal X at points A and B is the difference between the actual and ideal values of the jump at the transition step 94 in FIG. 3A. This difference is represented in FIG. 4A by the differencer 106 and becomes the calibration constant $C_{cal}$ for stage 7 which is used to cancel the gain errors of this stage.

Figure 4B:
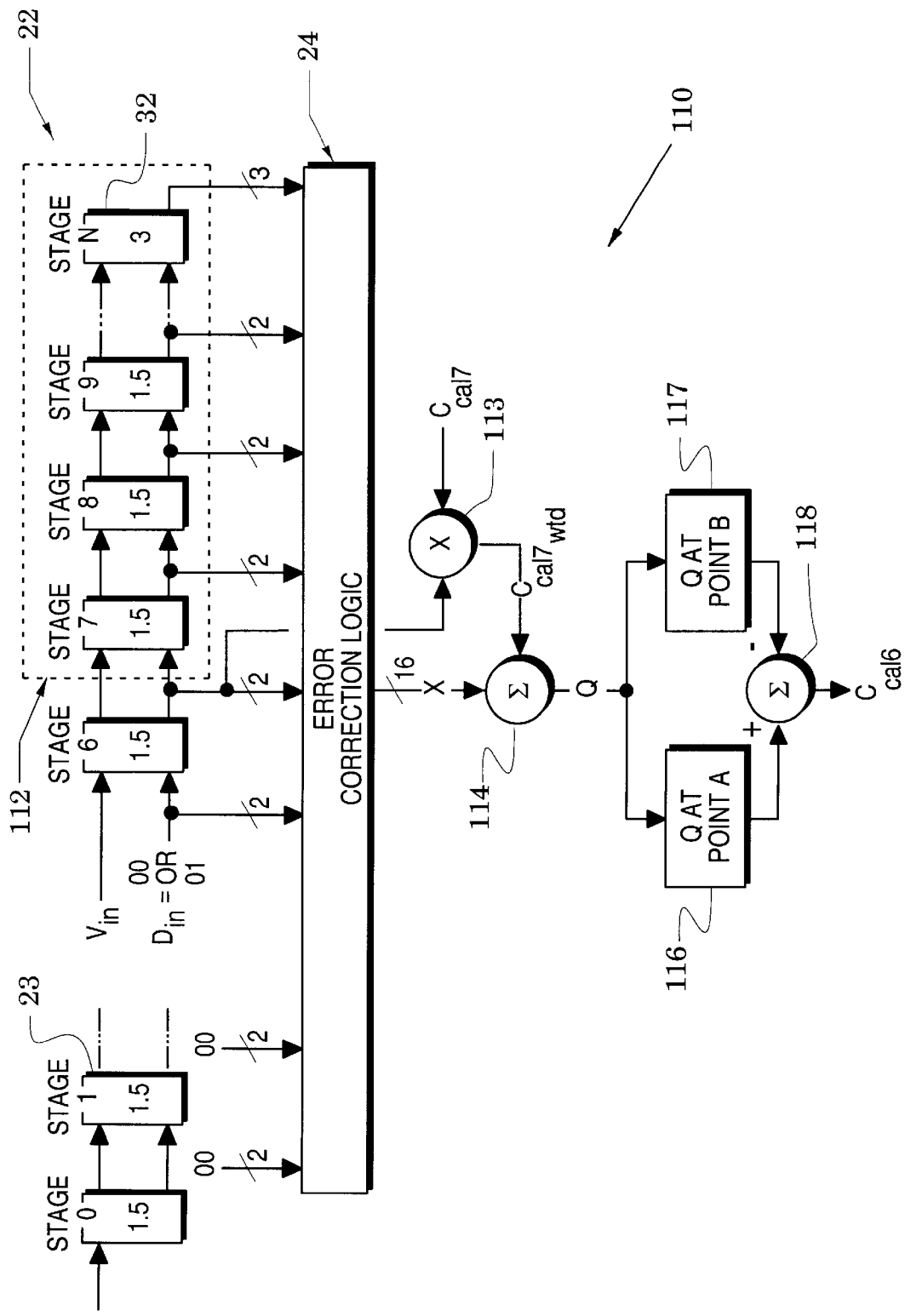

The above-described process is repeated for converter stage 6 as shown in the block diagram 110 of FIG. 4B which includes elements of FIG. 4A with like elements indicated by like reference numbers. The response of stage 6 is measured with a sub-ADC 112 that comprises succeeding stages, i.e., converter stages 7, 8, 9 - - - N) and includes the appropriately weighted calibration constant $C_{cal}$ for stage 7.

As shown in FIG. 4B, the stage 7 calibration constant $C_{cal}$ is multiplied in multiplier 113 by stage 7's digital input signal $D_{in}$ to realize a stage 7 weighted calibration constant $C_{cal_{wtd}}$. The digital output signal X of the error correction logic 24 is then summed in summer 114 with the stage 7 weighted calibration constant $C_{cal_{wtd}}$ to provide a weighted digital output signal Q.

When an input voltage $V_{in}$ of −0.25 volts is applied to stage 6 and its digital input signal $D_{in}$ is cycled between 00 and 01, weighted digital output signals Q are obtained that correspond to points A and B of the transition step 94 of FIG. 3A. These signals are represented by blocks 116 and 117 in FIG. 4B. The difference between the signal Q at points A and B is represented in FIG. 4B by the differencer 118 and becomes the calibration constant $C_{cal}$ for stage 6. The process exemplified in FIG. 4B is successively repeated for converter stages that successively precede stage 6.

Returning attention to FIG. 1, it is seen that the digital calibrator. 26 includes calibration constants $C_{cal}$ for converter stages 1–7 that were obtained in accordance with processes of FIGS. 4A and 4B. In operation of the ADC 20, an analog input signal at input port 30 is successively processed in successive converter stages. In processing the analog input signal, each stage successively provides an analog residue signal $S_{res}$ and a digital input signal $D_{in}$ to a succeeding stage. For converter stages 1–7, the digital input signal $D_{in}$ is multiplied by that stage's calibration constant $C_{cal}$ in a multiplier 120 to provide a corresponding weighted calibration constant $C_{cal_{wtd}}$.

The weighted calibration constants $C_{cal_{wtd}}$ in the digital calibrator 26 are summed with the corresponding digital output signal X from the error correction logic 24 to generate a corrected digital output signal Y which is then truncated in truncator 28 to provide a truncated digital output signal at the output port 34. The summing operation can be expressed as $$Y = X + \sum_{i}^{N} C_{cal}(i) D_{in}(i) \quad (3)$$

wherein N is the number of calibrated stages. In an exemplary realization, the corrected digital output signal Y is formed with a first summer 122 that generates a total calibration constant $C_{cal_{tot}}$ which is summed with the digital output signal X in a subsequent summer 124.

Figure 3B:
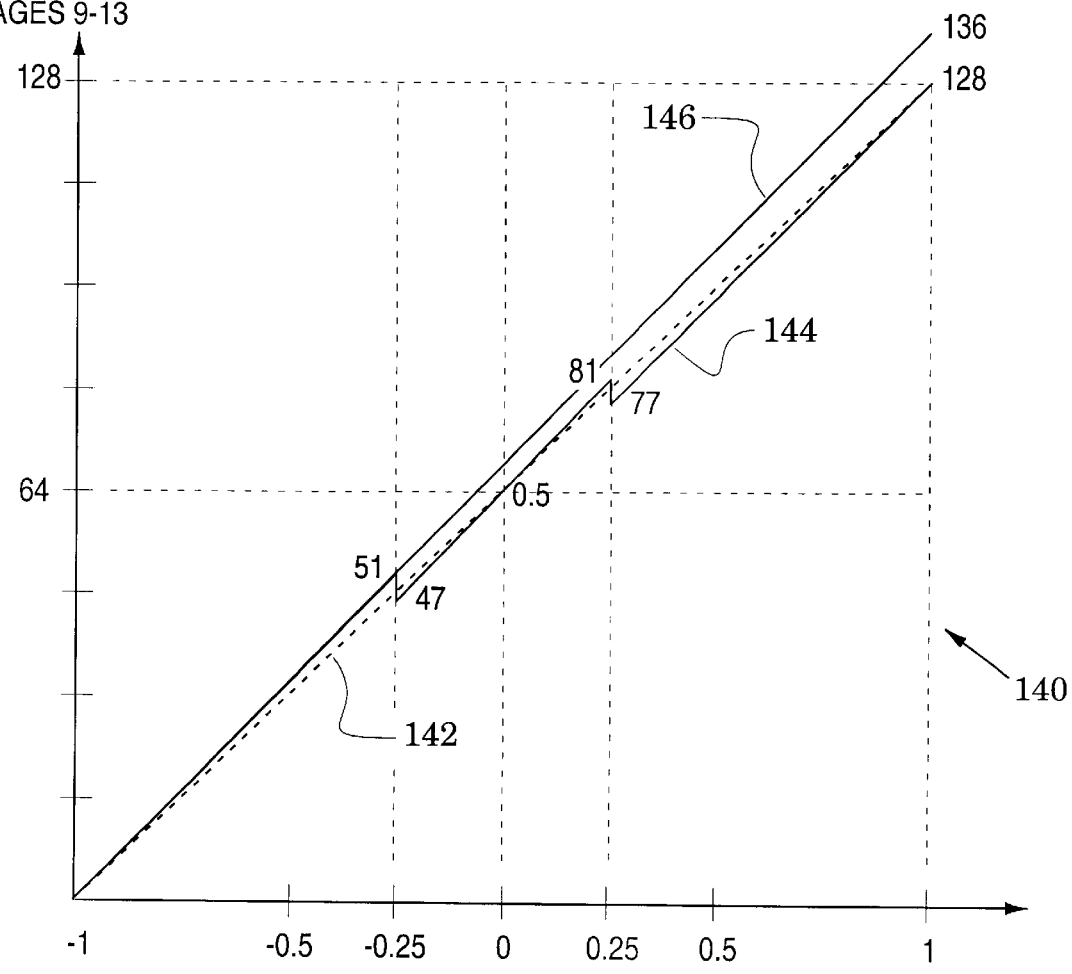
FIG. 3B is a transfer characteristic diagram for a sub-ADC in the ADC of FIG. 1.

An exemplary gain correction is shown in FIG. 3B in which a 13 stage pipelined ADC is assumed and it is further assumed that all stages are error free except converter stage 10 which has mismatched capacitors. The graph 140 of FIG. 3B represents the transfer characteristic of a sub-ADC formed of stages 9–13 and, in this example, FIG. 3A represents the residue transfer characteristic of converter stage 10.

A broken line 142 in FIG. 3B illustrates an ideal transfer characteristic of the sub-ADC which generates 128 binary codes (i.e., $2^7$ codes) in response to input residue signals to stage 9. A solid line 144 illustrates a transfer characteristic that is generated by the gain errors of stage 10. As shown, the solid line is comprised of line segments that are interrupted by gain errors of 4 codes because of corresponding gain errors at transition steps 94 and 96 of FIG. 3A. Thus, the combined code for an input signal of −0.25 jumps between 51 and 47 rather than have a correct value of 48 and, for an input signal of +0.25, jumps between 81 and 77 rather than have a correct value of 80.

The calibration methods exemplified in FIGS. 4A and 4B will thus realize a calibration constant of 4 for converter stage 10. When utilized as taught in FIG. 1, this calibration constant will correct the gain error at each of the transition steps 94 and 96 of FIG. 3A and yield a linear corrected transfer characteristic 146 in FIG. 3B. Although this linear transfer charactertic has an increased slope and realizes a code of 128+4+4=136 for a full-scale input signal, the gain error in the overall ADC can be adjusted or compensated in a system that includes the ADC.

Because the output of the sub-ADC is binary weighted and the LSB of stage 9 has the same weight as the MSB of the sub-ADC, converter stage 9 requires the same calibration constant as stage 10. For exactly the same reason, the ideal stage 8 requires a calibration constant which is the sum of calibration constants of stages 9 and 10. This phenomenon of calibration-constant propagation leads to larger calibration constants for front-end stages and, accordingly, a substantial number of bits for storage of the calibration constants. This storage problem is subsequently addressed with reference to FIGS. 6A and 6B.

Figure 5A:
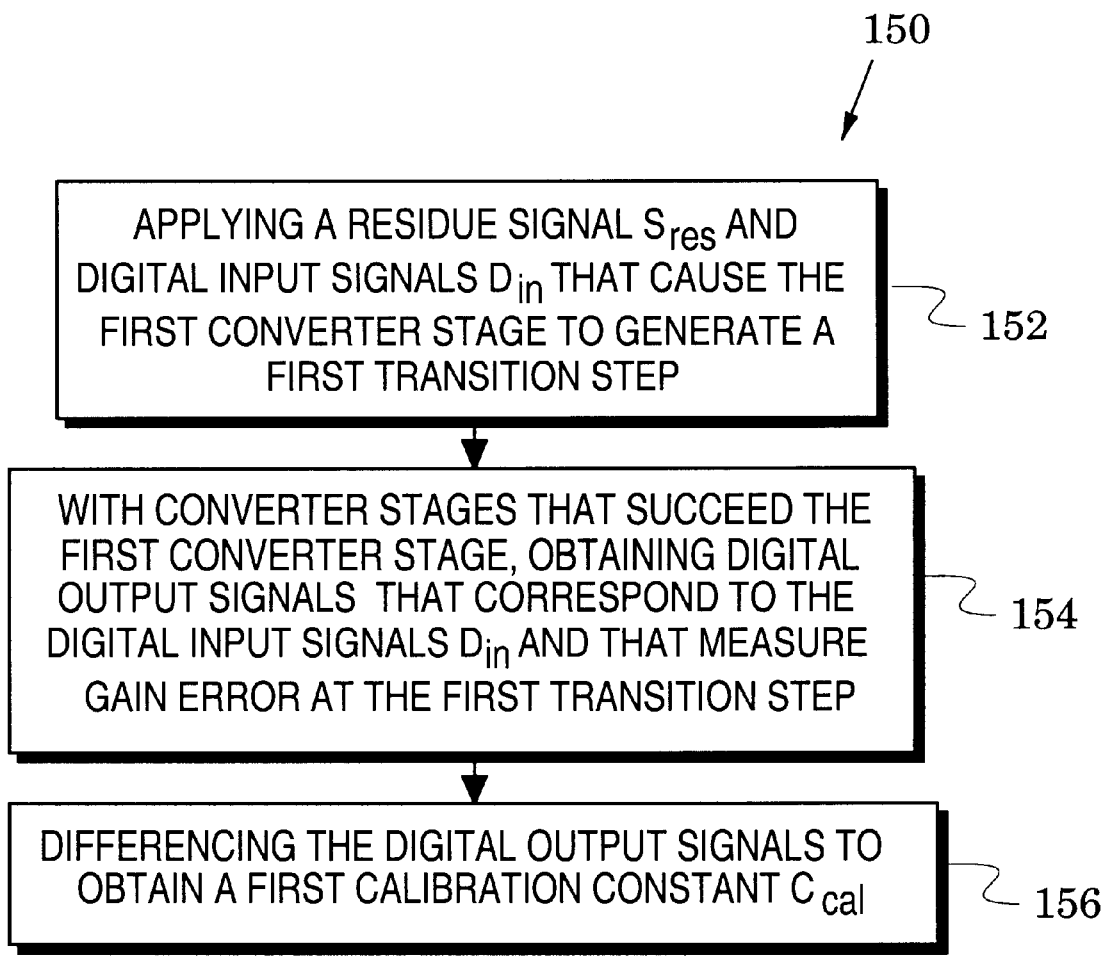
FIGS. 5A and 5B are flow charts that summarize calibration process steps for the ADC of FIG. 1.
Figure 5B:
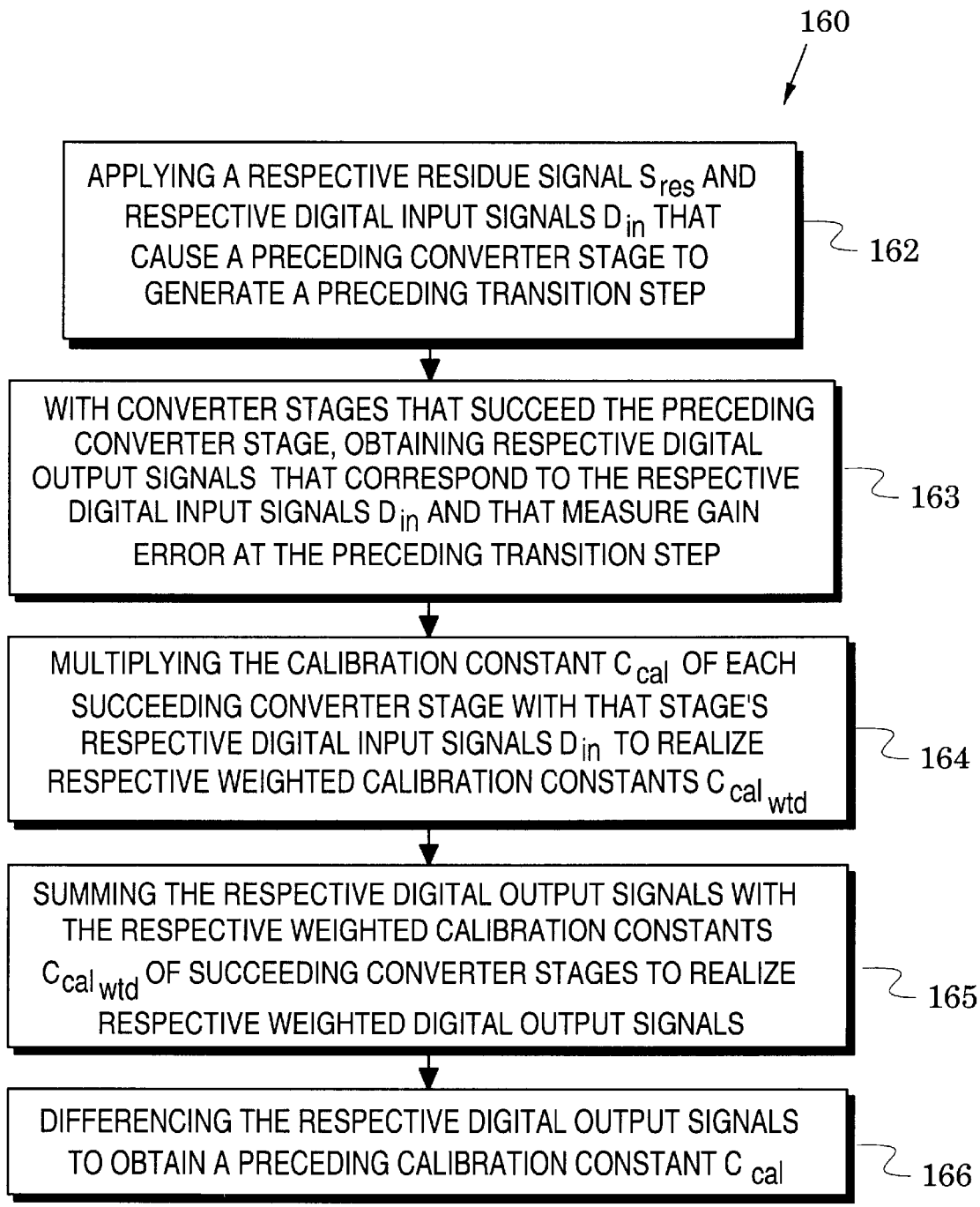

Calibration processes of the invention are summarized in the flow charts 150 and 160 of FIGS. 5A and 5B. In particular, FIG. 5A shows process steps that correspond to a first calibrated converter stage such as the converter stage 7 of FIG. 4A. In a first process step 152, a residue signal $S_{res}$ and digital input signals $D_{in}$ are applied to cause the first converter stage to generate a first transition step (e.g., the transition step 94 of FIG. 3A).

Process step 154 obtains digital output signals (e.g., the signals X of blocks 104 and 105 of FIG. 4A) that correspond to the digital input signals $D_{in}$ and that measure gain error at the first transition step. In a final process step 156, the digital output signals are differenced (e.g., in differencer 106 of FIG. 4A) to obtain a first calibration constant $C_{cal}$.

FIG. 5B shows process steps for converter stages that successively precede the first converter stage. Thus the steps of FIG. 5B are successively performed for each preceding stage (e.g., stages 1–6 in FIG. 4B). In a first process step 162, a respective residue signal $S_{res}$ and respective digital input signals $D_{in}$ are applied (e.g., to stage 6 in FIG. 4B) that cause a preceding converter stage to generate a preceding transition step.

Respective digital output signals are obtained in process step 163 that correspond to the respective digital input signals $D_{in}$ and that measure gain error at the preceding transition step (e.g., the transition step 94 of FIG. 3A). The calibration constant $C_{cal}$ of each succeeding converter stage is then multiplied (e.g., with multiplier 113 in FIG. 4B) in process step 164 with that stage's respective digital input signals $D_{in}$ to realize respective weighted calibration constants $C_{cal_{wtd}}$.

In process step 165, the respective digital output signals are summed (e.g., in summer 114 of FIG. 4B) with the respective weighted calibration constants $C_{cal_{wtd}}$ of succeeding converter stages to realize respective weighted digital output signals (Q in FIG. 4B). The respective weighted digital output signals are then differenced (e.g., in differencer 118 of FIG. 4B) in process step 166 to realize a preceding calibration constant $C_{cal}$.

The processes of the invention, e.g., those recited in FIGS. 5A and 5B, may be directed with various structures (e.g., digital gates and/or an appropriately-programmed data processor) that are associated with the digital calibrator 26 of FIG. 1 and indicated as gates/processor 190.

The calibration constants are typically stored at the end of the calibration cycle recited in FIGS. 5A and 5B and illustrated in FIGS. 4A and 4B. For example, they can be stored in a RAM to realize a calibration-type ADC or with trim fuses to realize a trimmed-type ADC. As mentioned above, calibration-constant propagation generally leads to large calibration constants for front-end converter stages which may require a substantial number of storage bits. Since each trim fuse and its associated circuitry occupies substantial chip area, the calibration constants are preferably stored in an efficient manner (this need is not as urgent for calibration-type ADCs as memory (e.g., volatile memory) is typically sufficient for storing the calibration constants).

Accordingly, the invention observes a redundancy in the calibration constants $C_{cal}$ and uses that redundancy in forming incremental constants $C_{inc}$ which are reduced in number and thus easier to store. In particular, the incremental constant $C_{inc}$ of a current stage is obtained by subtracting the calibration constants of all subsequent stages from the current stage's calibration constant. This conversion process can be expressed as $$C_{inc}(n) = C_{cal}(n) - \sum_{i=n+1}^{N} C_{cal}(i) \tag{4}$$

in which $C_{cal}(n)$ and $C_{inc}(n)$ are the calibration constant and incremental constant of a current stage n and N is the index of the last calibrated stage.

Figure 6A:
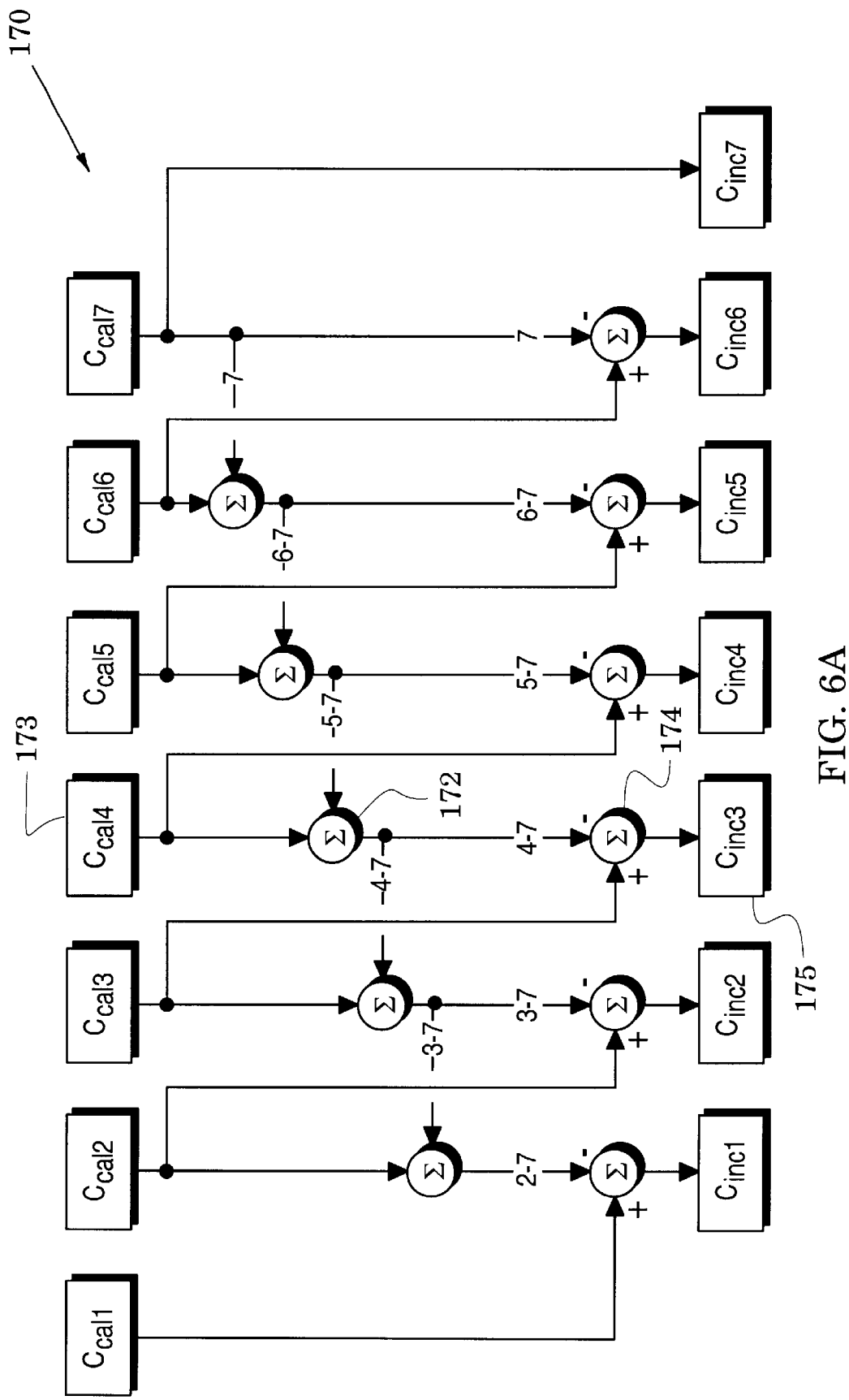
FIG. 6A is a block diagram that illustrates conversion of calibration constants to incremental constants.

The block diagram 170 of FIG. 6A illustrates an implementation embodiment for this conversion process in which a running sum of calibration constants is obtained with summers 172. For example, a summer 172 in FIG. 6A receives a sum of calibration constants 5 through 7 and sums it with calibration constant for stage 4 (shown as block 173) to form a sum of calibration constants 4 through 7. Each calibration constant is differenced in differencers 174 with the preceding running sum to form a corresponding incremental constant. For example, the calibration constant for stage 3 is differenced in a differencer 174 with the preceding sum (4 through 7) from summer 172 to form the incremental constant for stage 3 (shown as block 175).

Incremental constants $C_{inc}$ are especially useful in trimmed-type ADCs in which constants are permanently stored with poly fuses. In these ADCs, the incremental constants are preferably recovered at power-up from the stored calibration constants. This recovery process can be expressed as $$C_{cal}(n) = C_{inc}(n) + \sum_{i=n+1}^{N} C_{cal}(i) \tag{5}$$

which is derived from equation (4).

Figure 6B:
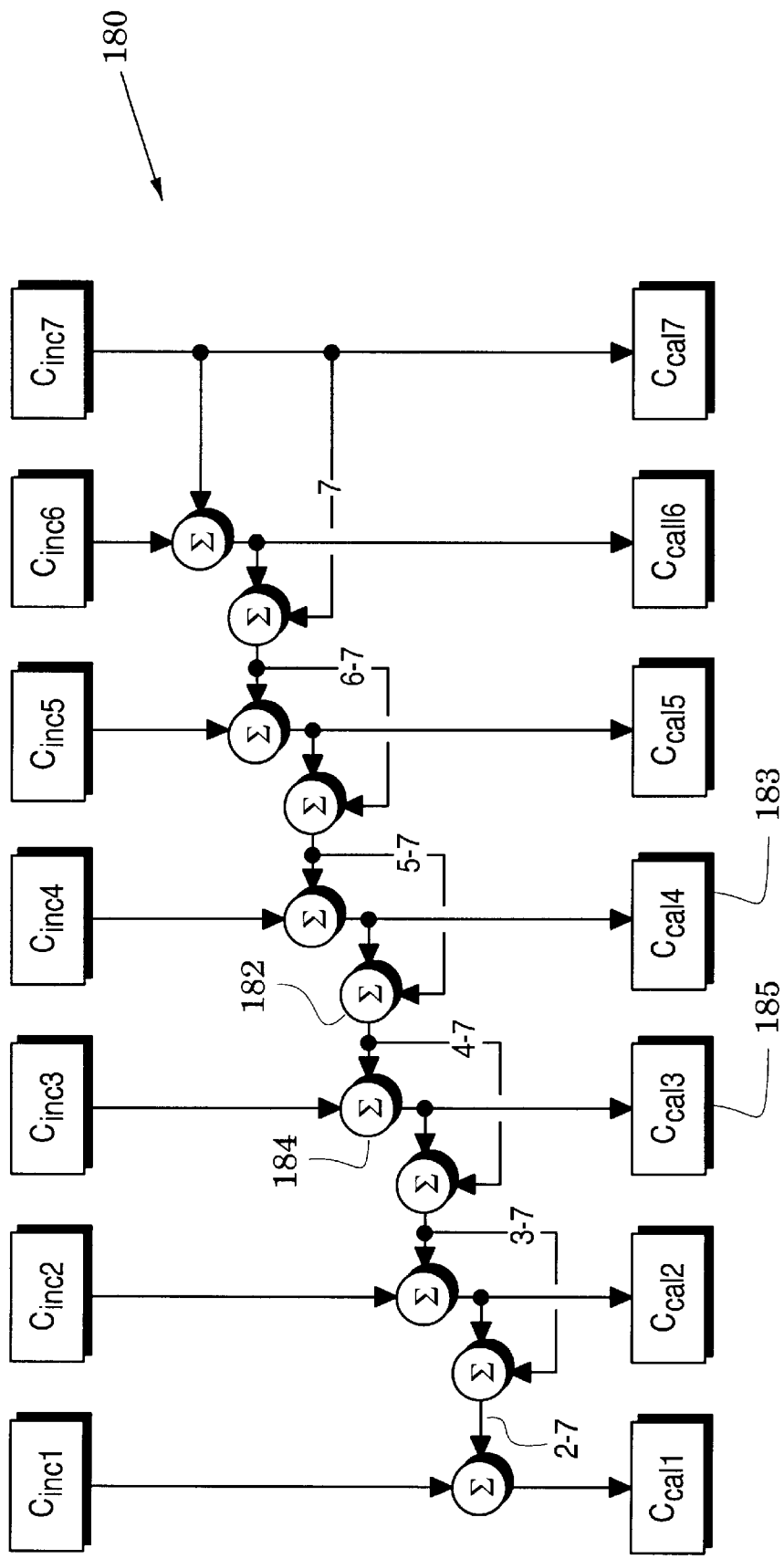
FIG. 6B is a block diagram that illustrates recovery of calibration constants from incremental constants.

The block diagram 180 of FIG. 6B illustrates an implementation embodiment for this recovery process in which a running sum of calibration constants is obtained with summers 182. For example, a summer 182 receives a sum of calibration constants 5 through 7 and sums it with the calibration constant for stage 4 (shown as block 183) to form a sum of calibration constants 4 through 7. Each incremental constant is summed in summers 184 with the preceding running sum of calibration constants to form a corresponding calibration constant. For example, the incremental constant for stage 3 is summed in a summer 184 with the preceding sum (4 through 7) of calibration constants from summer 182 to form a calibration constant for stage 3 (shown as block 185).

Simulation studies of the teachings of the invention were conducted for ADCs with 15, 16, 17 and 18 bits of internal resolution (at digital output signal X in FIG. 1) and truncation to 14 bits in which the last converter stage was a 3-bit stage and all others were 1.5-bit stages. When the number of calibrated front-end stages was set at 6, for example, it was found that approximately 33 to 50 bits were required to store calibration constants $C_{cal}$ and storage was reduced to approximately 27–45 bits for incremental constants $C_{inc}$.

In evaluating the calibration methods of the invention with the same ADC variations, a variety of capacitor mismatch conditions were assumed (from "good" matching to "poor" matching) in various poly-poly capacitor processes (e.g., 0.25 and 0.6 micron processes). In all variations, simulations found that the calibration methods of the invention substantially reduced INL and that this reduction improved until the number of calibrated front-end stages was successively increased to between six and ten. It was generally found that a large number of calibrated front-end stages are not required to achieve further reduction, i.e., the advantages of the invention may be realized with calibration of only a few front-end converter stages. Maximum INL for "good" and "poor" matching was found, for example to be less than 0.9 (LSB of 14 bits) when the number of calibrated front-end stages was eight.

Self-calibration methods and structures have been described for pipelined ADCs. The calibration teachings of the invention are especially suited for reducing ratiometric errors due to capacitor mismatch. The teachings also reduce finite-gain errors in stage amplifiers but the full reduction is generally realized over a limited temperature range because the amplifier gain typically changes too much over a wider range. In calibrated-type ADCs, however, the calibration can be repeated at various temperatures to enhance reduction of finite-gain errors.

Although the calibration teachings of the invention can be practiced with any serially-connected converter stage, they are especially suited for 1.5-bit converter stages because, a) these stages have equal slope in all segments of their residue transfer characteristic (e.g., as shown in FIG. 3A) so that the calibration constants needed for each stage are reduced to one, b) the use of calibration constants will improve both INL and DNL, and c) a wider range of digital error correction is realized so SHAs may be eliminated along with their added noise and power consumption.

The methods and structures of the invention obtain a number of advantages which include:

a) they can be realized without any external measuring instruments or calibrators—measurements are obtained with sub-ADCs of the pipelined structure, b) they can be realized without major change in pipeline structure, c) a calibrated ADC remains functional if calibration is disabled, and d) calibration coefficients can be economically stored.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A method for obtaining calibration constants that calibrate an analog-to-digital converter which has serially-connected converter stages with at least one converter stage having a residue transfer characteristic that includes a transition step, the method comprising the steps of:

for a first converter stage, applying a residue signal $S_{res}$ and digital input signals $D_{in}$ that cause said first converter stage to generate a first transition step;

obtaining digital output signals that correspond to said digital input signals $D_{in}$ and that measure gain error at said first transition step;

differencing said digital output signals to obtain a first calibration constant $C_{cal}$; and for converter stages that successively precede said first converter stage, successively performing the steps of:

a) applying a respective residue signal $S_{res}$ and respective digital input signals $D_{in}$ that cause a preceding converter stage to generate a preceding transition step;

b) obtaining respective digital output signals that correspond to said respective digital input signals $D_{in}$ and that measure gain error at said preceding transition step;

c) multiplying the calibration constant $C_{cal}$ of each succeeding converter stage with that stage's respective digital input signals $D_{in}$ to realize respective weighted calibration constants $C_{cal_{wtd}}$;

d) summing said respective digital output signals with the respective weighted calibration constants $C_{cal_{wtd}}$ of succeeding converter stages to realize respective weighted digital output signals; and e) differencing said respective weighted digital output signals to realize a preceding calibration constant $C_{cal}$;

wherein said first and preceding calibration constants $C_{cal}$ provide a calibrated analog-to-digital converter when they are multiplied by respective digital input signals $D_{in}$ and summed with digital output signals of said analog-to-digital converter.

2. The method of claim 1, further including the steps of:

realizing the obtaining step of said first converter stage with converter stages that succeed said first converter stage; and realizing the obtaining step of said preceding converter stages with converter stages that succeed said preceding converter stage.

3. The method of claim 1, further including, for each of said first and preceding converter stages, the step of differencing its calibration constant $C_{cal}$ and the sum of calibration constants $C_{cal}$ of all succeeding converter stages to realize a respective incremental constant $C_{inc}$.

4. The method of claim 3, further including, for each of said first and preceding converter stages, the step of recovering its calibration constant $C_{cal}$ as the sum of its incremental constant $C_{inc}$ and the calibration constants $C_{cal}$ of all succeeding converter stages.

5. The method of claim 3, further including, for each of said first and preceding converter stages, the step of storing said incremental constant $C_{inc}$.

6. The method of claim 5, wherein said storing step includes the step of placing said calibration constants in memory.

7. The method of claim 5, wherein said storing step includes the step of realizing said calibration constants with trim fuses.

8. The method of claim 1, wherein at least one converter stage is a 1.5 bit converter stage.

9. A method for calibrating an analog-to-digital converter which has serially-connected converter stages with at least one converter stage having a residue transfer characteristic that generates at least one transition step in response to respective residue signals $S_{res}$ and respective digital input signals $D_{in}$, the method comprising the steps of:

generating digital output signals in response to analog input signals;

providing respective calibration constants $C_{cal}$ for respective converter stages that correct a gain error in at least one transition step;

multiplying digital input signals $D_{in}$ of said respective converter stages by their respective calibration constants $C_{cal}$ to realize respective weighted calibration constants $C_{cal_{wtd}}$; and summing said digital output signals and said weighted calibration constants $C_{cal_{wtd}}$ to realize corrected digital output signals that correspond to said analog input signals.

10. The method of claim 9, wherein said providing step includes, for each of said respective calibration stages, the steps of:

differencing its respective calibration constant $C_{cal}$ and the sum of calibration constants $C_{cal}$ of all succeeding converter stages to realize a respective incremental constant $C_{inc}$; and storing said respective incremental constant $C_{inc}$.

11. The method of claim 9, wherein said storing step includes the step of placing said incremental constant $C_{inc}$ in memory.

12. The method of claim 9, wherein said storing step includes the step of realizing said incremental constant $C_{inc}$ with trim fuses.

13. The method of claim 9, further including, for each of said respective calibration stages, the step of recovering its calibration constant $C_{cal}$ as the sum of its incremental constant $C_{inc}$ and the calibration constants $C_{cal}$ of succeeding respective converter stages.

14. The method of claim 9, wherein said providing step includes the steps of:

for a first converter stage of said respective converter stages, applying a residue signal $S_{res}$ and digital input signals $D_{in}$ that cause said first converter stage to generate a first transition step;

obtaining digital output signals that correspond to said digital input signals $D_{in}$ and that measure gain error at said first transition step;

differencing said digital output signals to obtain a first one of said respective calibration constants $C_{cal}$ ; and for converter stages that successively precede said first converter stage, successively performing the steps of:
  a) applying a respective residue signal $S_{res}$ and respective digital input signals $D_{in}$ that cause a preceding converter stage to generate a preceding transition step;
  b) obtaining respective digital output signals that correspond to said respective digital input signals $D_{in}$ and that measure gain error at said preceding transition step;
  c) multiplying the calibration constant $C_{cal}$ of each succeeding converter stage with that stage's respective digital input signals $D_{in}$ to realize respective weighted calibration constants $C_{cal_{wtd}}$;
  d) summing said respective digital output signals with the respective weighted calibration constants $C_{cal_{wtd}}$ of succeeding converter stages to realize respective weighted digital output signals; and
  e) differencing said respective weighted digital output signals to realize a preceding one of said calibration constants $C_{cal}$.

15. The method of claim 14, further including the steps of:

realizing the obtaining step of said first converter stage with converter stages that succeed said first converter stage; and realizing the obtaining step of said preceding converter stages with converter stages that succeed said preceding converter stage.

16. The method of claim 9, wherein at least one converter stage is a 1.5 bit converter stage.

17. A method for storing calibration constants $C_{cal}$ that calibrate successive converter stages of an analog-to-digital converter wherein said converter stages each have a residue transfer characteristic that includes a transition step, the method comprising the steps of:

for each of said converter stages, differencing its calibration constant $C_{cal}$ and the sum of calibration constants $C_{cal}$ of all succeeding converter stages to realize a respective incremental constant $C_{inc}$; and for each of said converter stages, storing its respective incremental constant $C_{inc}$.

18. The method of claim 17, further including, for each of said first and preceding converter stages, the step of recovering its calibration constant $C_{cal}$ as the sum of its incremental constant $C_{inc}$ and the calibration constants $C_{cal}$ of all succeeding converter stages.

19. The method of claim 17, wherein said storing step includes the step of placing said calibration constants in memory.

20. The method of claim 17, wherein said storing step includes the step of realizing said calibration constants with trim fuses.

21. An analog-to-digital converter, comprising:

serially-connected converter stages that each provide a respective residue signal $S_{res}$ and respective digital input signals $D_{in}$ to a succeeding converter stage in response to an analog input signal to said analog-to-digital converter wherein at least one converter stage has a residue transfer characteristic that generates at least one transition step in response to its respective residue signal $S_{res}$ and respective digital input signals $D_{in}$;

a final converter stage that provides a digital output signal $D_{out}$ in response to a residue signal $S_{res}$ and digital input signals $D_{in}$ from a final one of said serially-connected converter stages;

digital correction logic that converts said digital input signals $D_{in}$ and said digital output signal $D_{out}$ into a digital output signal that corresponds to said analog input signal; and a digital calibrator that:
  a) provides respective calibration constants $C_{cal}$ for respective converter stages that correct a gain error in at least one transition step;
  b) multiplies digital input signals $D_{in}$ of said respective converter stages by their respective calibration constants $C_{cal}$ to realize respective weighted calibration constants $C_{cal_{wtd}}$; and
  c) sums said digital output signals and said weighted calibration constants $C_{cal_{wtd}}$ to realize corrected digital output signals that correspond to said analog input signals.

22. The analog-to-digital converter of claim 19, wherein said digital calibrator includes a plurality of digital gates that are configured to perform said provides, multiplies and sums operations.

23. The analog-to-digital converter of claim 19, wherein said digital calibrator includes a data processor that is programmed to perform said provides, multiplies and sums operations.

24. The analog-to-digital converter of claim 21, wherein at least one of said serially-connected converter stages is a 1.5 bit converter stage.

25. The analog-to-digital converter of claim 21, wherein said digital calibrator stores incremental constants $C_{inc}$ and recovers each of said calibration constants $C_{cal}$ as the sum of a respective incremental constant $C_{inc}$ and the calibration constants $C_{cal}$ of succeeding respective converter stages.

26. The analog-to-digital converter of claim 25, wherein said digital calibrator includes a memory which holds said incremental constants $C_{inc}$.

27. The analog-to-digital converter of claim 25, wherein said digital calibrator includes trim fuses which provide said incremental constants $C_{inc}$.

\* \* \* \* \*